(12) United States Patent
Adams

(10) Patent No.: US 7,079,059 B2
(45) Date of Patent: Jul. 18, 2006

(54) ADC WITH DIGITAL ERROR CORRECTION

(75) Inventor: Neil Adams, Thoiry (FR)

(73) Assignee: Acqiris, Plans-les-Ouates (CH)

( * ) Notice: Subject to any disclaimer, the term of this patent is extended or adjusted under 35 U.S.C. 154(b) by 0 days.

(21) Appl. No.: 11/006,105

(22) Filed: Dec. 7, 2004

(65) Prior Publication Data

US 2005/0151679 A1    Jul. 14, 2005

(30) Foreign Application Priority Data

Dec. 12, 2003    (EP)    ................................. 03104679

(51) Int. Cl.
*H03M 1/10* (2006.01)
(52) U.S. Cl. ........................ 341/120; 341/118; 341/155
(58) Field of Classification Search ................ 341/155, 341/156, 143, 159, 141, 118, 120, 160
See application file for complete search history.

(56) References Cited

U.S. PATENT DOCUMENTS

| | | | |
|---|---|---|---|
| 5,157,395 A * | 10/1992 | Del Signore et al. ....... | 341/143 |
| 5,262,972 A | 11/1993 | Holden et al. | |
| 5,294,926 A * | 3/1994 | Corcoran ..................... | 341/120 |
| 5,432,813 A * | 7/1995 | Barham et al. ............. | 375/152 |
| 6,337,885 B1 * | 1/2002 | Hellberg ..................... | 375/316 |
| 6,384,756 B1 * | 5/2002 | Tajiri et al. ................. | 341/120 |
| 6,430,671 B1 * | 8/2002 | Smith ......................... | 711/220 |
| 6,567,030 B1 | 5/2003 | Pupalaikis | |
| 6,600,438 B1 * | 7/2003 | Hilton ........................ | 341/155 |
| 6,836,227 B1 * | 12/2004 | Asami ........................ | 341/118 |
| 6,836,235 B1 * | 12/2004 | Asami ........................ | 341/155 |
| 6,956,517 B1 * | 10/2005 | Baker et al. ................ | 341/155 |
| 2004/0032358 A1* | 2/2004 | Asami ........................ | 341/155 |
| 2005/0017886 A1* | 1/2005 | Asami ........................ | 341/118 |

\* cited by examiner

*Primary Examiner*—Linh V. Nguyen
(74) *Attorney, Agent, or Firm*—Pearne & Gordon LLP

(57) ABSTRACT

Interleaved Analogue to Digital converter, comprising a plurality of individual ADCs (71). A digital filter stage (20) is used for equalizing the responses of the individual ADCs, and comprises a FIR filter in which the coefficient table is cyclically reloaded between ADCs' samples, in order to reduce the number of multipliers required.

13 Claims, 3 Drawing Sheets

ADC WITH DIGITAL ERROR CORRECTION

REFERENCE DATA

This application claims priority from European Patent Application N° EP03104679.0 filed on Dec. 12, 2003, the contents whereof are hereby incorporated by reference.

FIELD OF THE INVENTION

The present patent application relates to an Analogue to Digital Converter (ADC), and in particular to an ADC including a plurality of time-interleaved converters for increasing the overall conversion rate and a correction scheme for compensating the errors which might arise by mismatches in individual converters.

DESCRIPTION OF RELATED ART

In data acquisition systems using Analogue to Digital Converters (ADC), a technique of time-interleaving several identical ADC of lower conversion rate is often used to increase the overall conversion rate. By employing a large number of individual slow ADCs, it is possible to achieve extremely high overall conversion speeds.

However, this technique finds a limitation in the fact that the individual responses of the individual ADCs, like for example Gain, Delay, Nonlinearity or Offset, can never be strictly identical. This mismatch is reflected in unwanted distortions of the acquired signal, which manifest themselves in the frequency domain as spurious spectral components.

The problem of spurious components in interleaved digitizers is well known and a number of devices have been devised in order to correct or compensate these unwanted components. On the other hand, the complex frequency dependence of the mismatches requires complex correction architectures which, in many cases, constitute a major part of the electronic circuitry.

U.S. Pat. No. 567,030 describes a high-bandwidth interleaved acquisition system in which the outputs of individual ADC are treated by digital synthesizers in order to compensate for individual variations of the ADC. Each synthesizer may be implemented as a FIR filter or as a IIR filter.

U.S. Pat. No. 5,239,299 describes another ADC system comprising a plurality of individual converters, operated in time-interleaved mode. In this device, one converter is arbitrarily selected as reference converter, and the remaining converters are compensated for variations in gain, offset, phase/frequency response by an array of FIR filters.

For a system with N ADCs and requiring a filter length of K for good correction fidelity, the known solutions described above require N×K digital multipliers or, at best, (N−1)×K multipliers if one of the ADCs is selected as reference converter. Since digital multipliers are expensive in terms of used silicon space and power consumption, a further reduction of their number would be highly desirable.

In terms of silicon area, the space occupied by the filters of the devices of the prior art may easily exceed that taken by the converters themselves. Space and cost considerations may, in some cases, intervene to limit the complexity and the depth of the filtering circuits adopted, and the precision of the correction must sometimes be sacrificed to achieve a simpler construction.

It is an aim of the present invention to provide an error-corrected interleaved ADC, which is free from the above shortcomings of the known devices.

It is a further aim of the present invention to provide an interleaved ADC, which requires a smaller number of components and can be produced in a more economical fashion, and which has a smaller size than the above known devices.

It is a further aim of the present invention to provide an interleaved ADC system exhibiting a more precise error correction, and a lower distortion of the digitized signal.

BRIEF SUMMARY OF THE INVENTION

These and other aims of the present invention are attained by the devices comprising the features of the independent claims, with the dependent claims illustrating other optional features of the invention. In particular, these aims are attained by a Analogue to Digital converter circuit comprising:

a plurality of individual ADCs, each of said individual ADCs having an individual response, a clock generating circuit for clocking said individual ADCs, said individual ADCs and said clock generating circuit being arranged to generate samples of the amplitude of an input signal by said individual ADCs one at a time in a cyclical ADC sequence, a digital filter for correcting differences between said individual responses, said digital filter comprising computing means, for computing a function of said samples by said individual ADCs, said function depending on a coefficient table loaded into said filter, characterized in that said digital filter comprises coefficient loading means (17) for changing said coefficient table, synchronously with a transition of a signal of said clock generating circuit.

BRIEF DESCRIPTION OF THE DRAWINGS

The present invention will be better understood by referring to the detailed description, and illustrated by the drawings in which.

DETAILED DESCRIPTION OF THE INVENTION

Figure 2:
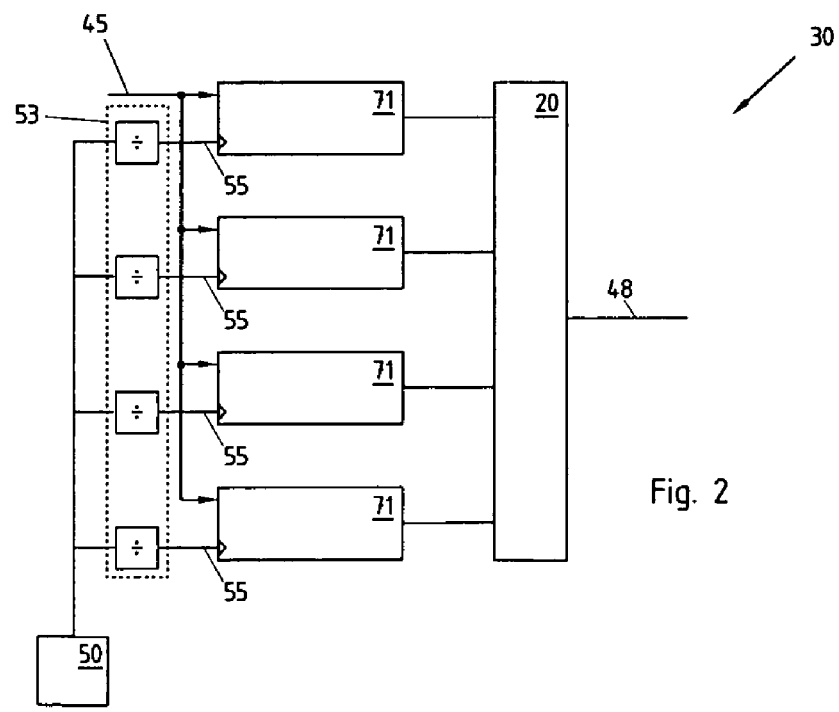
FIG. 2 represents an interleaved ADC according to an aspect of the present invention.

FIG. 2 schematically represents an interleaved ADC according to the present invention. The ADC 30 comprises a clock generator 50 having a frequency F, for synchronizing the various operations of the ADC. The clock generator may include a local clock oscillator, not represented, or generate a clock signal in dependence on an external clock input, for example if the ADC is an element of a multi-channel acquisition system. An analogue signal, whose amplitude must be digitized, is present at an analogue input 45. Although not represented on this figure, it is to be understood that the device of the invention may also include a variety of analogue signal conditioning means, like for example filters, anti-aliasing filters, voltage protection networks, attenuators, impedance matching circuits, amplifiers or the like, and that the analogue signal may be a voltage signal as well as a current signal.

The analogue signal 45 is fed to the inputs of a plurality of N individual ADC 71 for transforming into a time series of digital samples. In FIG. 2, N is set equal to four, by way of example. However any number of individual ADCs may be implemented.

Each individual ADC 71 operates synchronously to an individual sub-clock signal 55, whose frequency F/N is a sub-multiple of order N of the frequency F of the overall clock signal 51, and whose phase is adapted for providing a regular interleaving of the samples generated by the individual ADCs 71. A sub-clock generator 53 produces the required sub-clock signals, for example by an array of modulo-N dividers whose input is connected to the main clock signal 51.

The digital samples produced by the individual ADC 71 are then fed to the digital filter 20. According to the circumstances, the corrected signals are then stored in a memory buffer (not represented), for later analysis, or further processed on line.

Figure 1A:
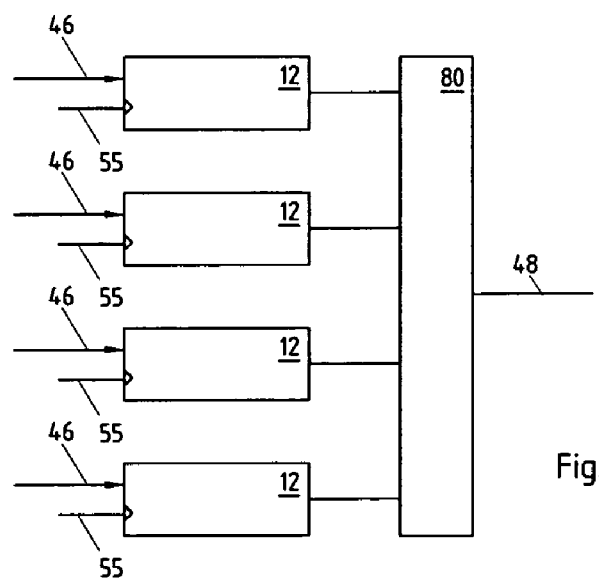
FIGS. 1a and 1b represent a digital error-correction filter of known type, suitable for an interleaved ADC system.

FIG. 1a represents a digital filter for an N ADC system of known type. This filter comprises N independent FIR blocks 12, each of which computes a corrected signal for a specific ADC and operates at a clock frequency F/N, synchronously with the corresponding ADC. The individual correction signals are then reunited by the multiplexer 80 into an overall corrected signal.

Figure 1B:
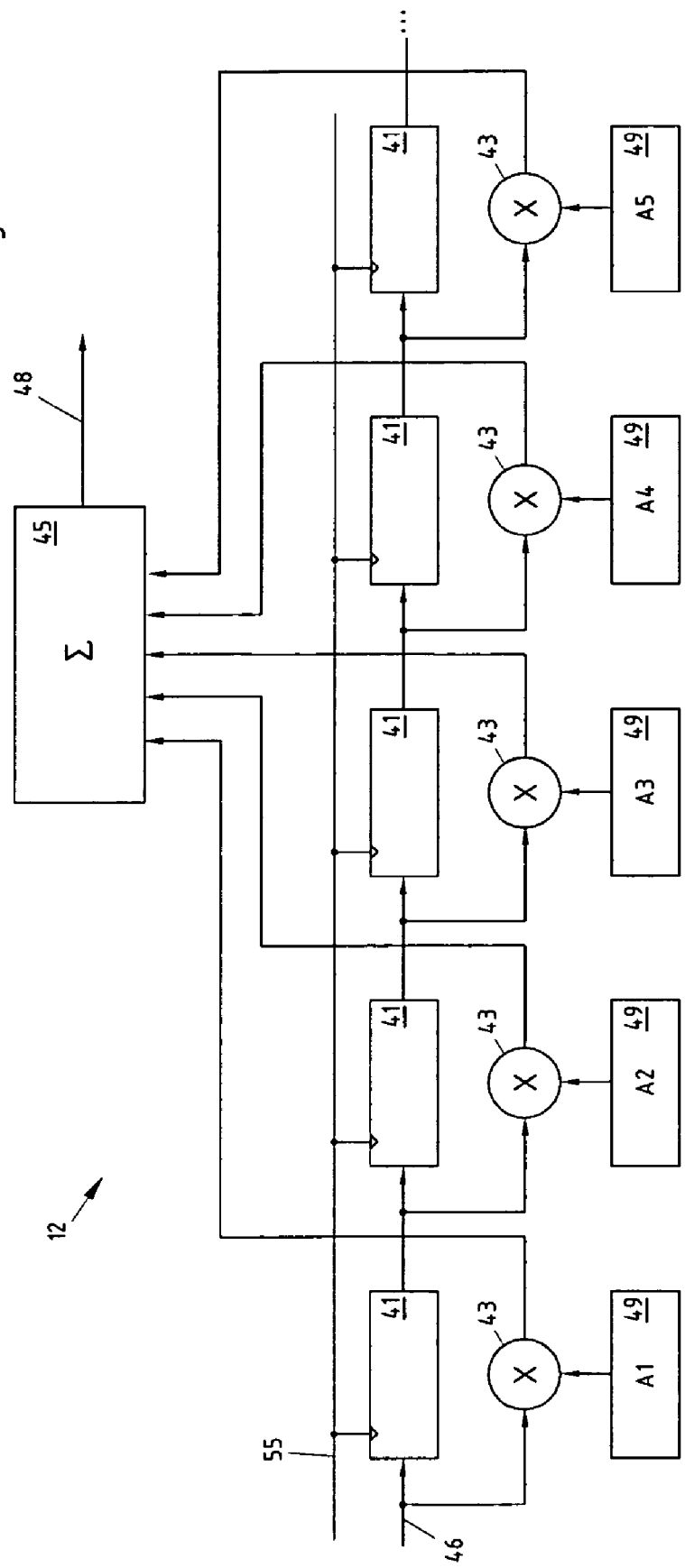

Each of the FIR blocks of FIG. 1a comprises an array of registers and digital multipliers, as shown on FIG. 1b.

The FIR block generates a linear combination of a series of successive samples in the input signal, determined by a table of coefficients whose values are set in order to minimize the differences of the responses of the individual ADCs 71. In the represented architecture, each element of the combination corresponds to a register 41 and to a digital multiplier 43.

Figure 3:
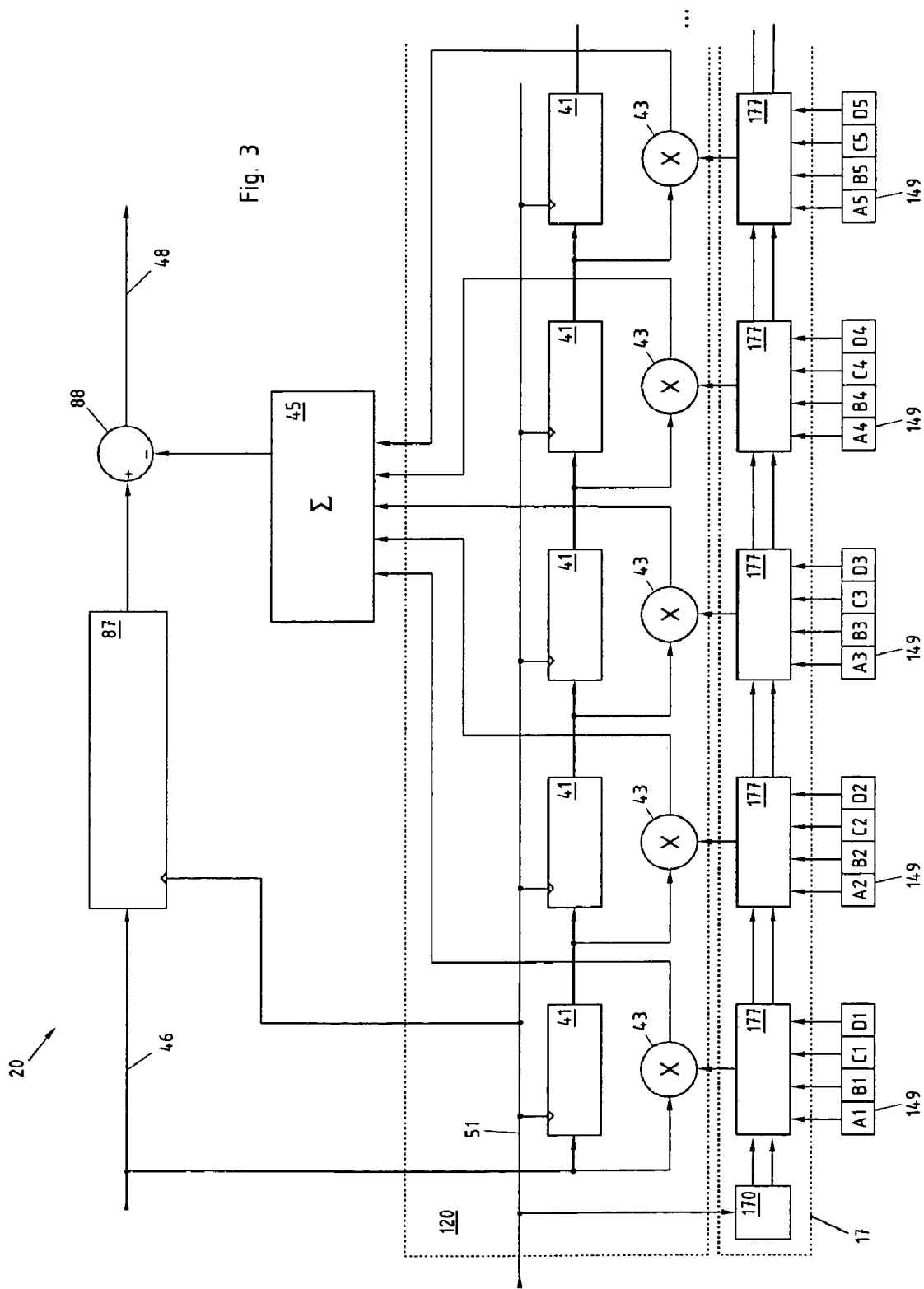
FIG. 3 represents the functioning of a digital error-correction filter according to an aspect of the present invention.

The number of samples entering in the filter response may vary, according to the case. In the example of FIG. 3, only the five first pairs of registers and multipliers are represented. It is to be understood, however that the present invention is not limited to a specific number of samples. Each of the multipliers 43 multiplies the sample codes progressing along the FIR by a fixed coefficient $A_1$, $A_2$, etc. stored in a coefficient register 49. The coefficients are chosen in order to optimally compensate the response differences of the N individual ADCs 71.

Although the individual FIR blocks 12 operate at the reduced clock frequency F/N, each of the individual FIR blocks must process samples from all the individual ADC's 71. This requires a large number of multipliers in the system, which results in an increased circuit size and cost.

According to an aspect of the present invention, explained now with reference to FIG. 3, the filter 20 comprises a FIR filter block 120. Advantageously, the FIR filter block 120 does not operate on the full dynamics of the signal, but only produces a correction signal, representing the difference between the uncorrected codes 46 produced by the ADC 71, and an "ideal" signal in which the ADCs 71 have identical responses. To this effect, the filter 20 comprises a digital delay 87, for storing the uncorrected signal codes during the computation of the error signal by the FIR block 120, and a digital subtraction node 88 for combining the correction signal and the uncorrected signal codes 46 into a corrected signal 48.

Because the errors are generally small compared to the original signal, any inaccuracies in the correction system, caused by such things as miscalibrations or rounding errors in the digital arithmetic, are reduced to "second order" errors, and thus this technique can be applied to higher resolution acquisition systems than previously possible.

The FIR block 120 accepts as input the uncorrected multiplexed data 46 coming from the N ADC 71, and is clocked at the full clock speed F. Each of the coefficient registers 49 of FIG. 1b is however replaced by a bank 149 of N registers, thus defining N distinct coefficient tables $A_1$, $A_2$, $A_3$ ...; $B_1$, $B_2$, $B_3$ ...; $C_1$, $C_2$, $C_3$ ...; $D_1$, $D_2$, $D_3$ ...; one for each of the N ADCs.

A modulo-N counter 170 drives the multiplexers 177 so that the coefficient table is reloaded between multiply operations. In this case, we have only one FIR block 120, which cyclically loads the coefficient table for first ADC on data samples corresponding to first ADC, the coefficient table for second ADC on data samples corresponding to second ADC, and so on.

By the disposition of the invention, one FIR block 120 replaces the N blocks 12 of the known filter of FIG. 1a. The number of required multipliers is then equal to the length K of the FIR block, for any number of ADCs in the system. The number of multipliers is thus reduced by a factor N, which results in a space and power saving in the circuit.

The present invention comprises also the case in which the FIR filters are replaced by IIR filters or by other kind of digital processors, producing a generic predetermined function of the uncorrected samples, in dependence on a coefficient table, and in which the coefficient table is reloaded synchronously with the interleaving scheme of the individual ADCs.

The invention claimed is:

1. An analogue to Digital converter circuit comprising,
a plurality of individual ADCs, each of said individual ADCs having an individual response,
a clock generating circuit for clocking said individual ADCs, wherein said individual ADCs and said clock generating circuit are arranged to generate samples of the amplitude of an input signal by said individual ADCs one at a time in an cyclical ADC sequence,
a digital filter for correcting differences between said individual responses,
said digital filter comprising computing means, for computing a function of said samples by said individual ADCs, said function depending on a coefficient table loaded into said filter, wherein said digital filter comprises coefficient loading means for changing said coefficient table synchronously with a transition of a signal of said clock generating circuit.

2. The circuit of claim 1, further comprising registers for storing individual coefficient tables relative to said individual ADCs, and wherein said coefficient loading means are operatively arranged to load said individual coefficient tables one at a time in a cyclical sequence.

3. The circuit of claim 2, wherein said coefficient loading means are operatively arranged to load said individual coefficient tables synchronously with said cyclical ADC sequence.

4. The circuit of claim 3, including one of said individual coefficient tables for each of said individual ADCs.

5. The circuit of claim 2, wherein said coefficient loading means comprises an array of multiplexers and a counter for cyclically loading one of said individual coefficient tables.

6. The converter of claim 1, wherein said digital filter comprises at least one FIR filter.

7. The circuit of claim 1, wherein said computing means comprises an array of multipliers for extracting a linear combination of a time sequence of said samples.

8. The circuit of claim 1, wherein said ADCs are clocked at a frequency F/N, whereas the filter and/or said loading is clocked at a frequency F, with N not being 1 or zero.

9. A digital processing circuit for correcting digital signals produced by a plurality of interleaved individual digital sources, comprising:
   computing means for computing a function of digital samples by said individual digital sources, said function depending on a coefficient table loaded into said filter, wherein
   said digital filter comprises coefficient loading means for changing said coefficient table synchronously with the interleaving scheme of said individual digital sources.

10. The Digital processing circuit of claim 9, further comprising registers for storing individual coefficient tables relative to said individual sources, and wherein said coefficient loading means are operatively arranged to load said individual coefficient tables one at a time in a cyclical sequence.

11. The processing circuit of claim 10, wherein said coefficient loading means comprises an array of multiplexers and a counter for cyclically loading one of said individual coefficient tables.

12. The processing circuit of claim 9, wherein said interleaved digital sources are operatively arranged to generate a time series of digital samples, and said computing means comprises an array of multipliers for extracting a linear combination of a sequence of said samples.

13. An analogue to Digital converter circuit comprising,
   a plurality of N individual ADCs, with N being an integer greater than one and each of said individual ADCs having an individual response,
   a clock generating circuit for clocking said individual ADCs, wherein said individual ADCs and said clock generating circuit are arranged to generate samples of the amplitude of an input signal by said individual ADCs one at a time in an cyclical ADC sequence,
   a digital filter for correcting differences between said individual responses,
   said digital filter comprising computing means, for computing a function of said samples by said individual ADCs, said function depending on a coefficient table loaded into said filter, wherein
   said digital filter comprises coefficient loading means for loading said coefficient table synchronously with a transition of a signal of said clock generating circuit, and further wherein
   the ADCs are clocked at a frequency F/N, whereas the filter and/or said loading is clocked at a frequency F.

* * * * *